(12) United States Patent
Lee et al.

(10) Patent No.: US 9,153,654 B2
(45) Date of Patent: Oct. 6, 2015

(54) SEMICONDUCTOR DEVICE WITH BURIED BIT LINE AND METHOD FOR FABRICATING THE SAME

(71) Applicant: SK hynix Inc., Gyeonggi-do (KR)

(72) Inventors: Sang-Do Lee, Gyeonggi-do (KR);
Hae-Jung Lee, Gyeonggi-do (KR);
Kyung-Bo Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/317,959

(22) Filed: Jun. 27, 2014

(65) Prior Publication Data
US 2014/0306278 A1    Oct. 16, 2014

Related U.S. Application Data

(62) Division of application No. 13/244,208, filed on Sep. 23, 2011, now Pat. No. 8,779,422.

(30) Foreign Application Priority Data

Jul. 4, 2011    (KR) .................. 10-2011-0066095

(51) Int. Cl.
*H01L 29/04* (2006.01)
*H01L 29/417* (2006.01)
*H01L 27/108* (2006.01)
*H01L 27/12* (2006.01)
*H01L 29/66* (2006.01)
*H01L 29/786* (2006.01)

(52) U.S. Cl.
CPC .... *H01L 29/41741* (2013.01); *H01L 27/10823* (2013.01); *H01L 27/10885* (2013.01); *H01L 27/10888* (2013.01); *H01L 27/12* (2013.01); *H01L 29/41766* (2013.01); *H01L 27/1214* (2013.01); *H01L 29/66757* (2013.01); *H01L 29/78675* (2013.01); *Y02E 10/50* (2013.01)

(58) Field of Classification Search
CPC ................... H01L 29/41741; H01L 29/41766
USPC ......................................................... 257/51
See application file for complete search history.

(56) References Cited

U.S. PATENT DOCUMENTS

2006/0113587 A1*  6/2006  Thies et al. .................. 257/328
2007/0210374 A1*  9/2007  Wu ............................... 257/329

* cited by examiner

*Primary Examiner* — Anthony Ho
(74) *Attorney, Agent, or Firm* — IP & T Group LLP

(57) ABSTRACT

A semiconductor device includes an active body having two sidewalls facing each other in a lateral direction, a junction formed in a sidewall of the two sidewalls, a dielectric layer having an open portion to expose the junction and covering the active body, a junction extension portion having a buried region to fill the open portion, and a bit line coupled to the junction extension portion.

11 Claims, 19 Drawing Sheets

SEMICONDUCTOR DEVICE WITH BURIED BIT LINE AND METHOD FOR FABRICATING THE SAME

CROSS-REFERENCE TO RELATED APPLICATIONS

This application is a division of U.S. patent application Ser. No. 13/244,208 filed on Sep. 23, 2011, which claims priority of Korean Patent Application No. 10-2011-0066095, filed on Jul. 4, 2011. The disclosure of each of the foregoing application is incorporated herein by reference in its entirety.

BACKGROUND

1. Field

Exemplary embodiments of the present invention relate to technology for fabricating a semiconductor device, and more particularly, to a semiconductor device with a buried bit line and a method for fabricating the same.

2. Description of the Related Art

To increase the amount of memory cells on a chip, patterns may be shrunk. Due to pattern shrinkage, a mask for a mask process may also be smaller in size. Accordingly, a sub-40 nm semiconductor device may adopt an ArF photoresist (PR) layer. However, as an even smaller pattern is desired, the ArF PR layer may not be suitable for a smaller pattern application.

Therefore, a semiconductor device, such as a DRAM memory device, may use 3-dimensional cell formation techniques.

A transistor with a planar channel has a physical limit in a leakage current, an on current, and a short channel effect if the semiconductor device is further miniaturized. Therefore, it is difficult to further miniaturize the semiconductor device. However, a transistor using a vertical channel (hereafter, referred to as a vertical channel transistor) may further miniaturize the semiconductor device.

The vertical channel transistor includes an active region extended vertically over a substrate, a gate electrode (referred to as a vertical gate (VG)) formed on a sidewall of the active region, and a junction formed over and under the active region. The vertical gate is set to be the center of the active region. In such a vertical channel transistor, the vertical gate vertically forms a channel. The lower junction is coupled to a buried bit line (BBL).

FIG. 1 illustrates a conventional semiconductor device.

Referring to FIG. 1, a plurality of bodies 13 isolated by trenches 12 are formed on a substrate 11. The bodies 13 correspond to active regions and extend vertically from the surface of the substrate 11. A hard mask layer 14 is formed on the bodies 13. A junction 16 is formed on one sidewall of each body 13. A dielectric layer 15 is formed on both sidewalls of the body 13. A part of the dielectric layer 15 is selectively removed to form an open portion, which exposes the junction 16. A buried bit line 18 is electrically coupled to the junction 16 through the open portion and partially fills the trench 12. A barrier layer 17 is formed to prevent diffusion between the buried bit line 18 and the junction 16.

In the conventional semiconductor device of FIG. 1, the buried bit line 18 is formed of a metal layer to reduce resistance. In order to form a contact between the junction 16 and the buried bit line 18, a manufacturing process includes a side contact process for exposing one sidewall of the body 13. The side contact process is referred to as a one side contact (OSC) process.

When a metal layer is used as the buried bit line 18, an ohmic contact may be formed to reduce contact resistance with the junction 16, which is formed of single crystal silicon. The ohmic contact 19 may be formed of a silicide layer.

In this case, however, silicide agglomeration is caused by a thermal process accompanying the silicide process. Such silicide agglomeration may cause a loss of the junction 16, and a junction leakage increases.

SUMMARY

An embodiment of the present invention is directed to a semiconductor memory device capable of preventing a loss of a junction caused by silicide agglomeration and a junction leakage, and a method for fabricating the same.

In accordance with an embodiment of the present invention, a semiconductor device includes: an active body having two sidewalls facing each other in a lateral direction; a junction formed in a sidewall of the two sidewalls; a dielectric layer having an open portion to expose the junction and covering the active body; a junction extension portion having a buried region to fill the open portion; and a bit line coupled to the junction extension portion.

In accordance with another embodiment of the present invention, a semiconductor device includes: a plurality of active bodies isolated by a plurality of trenches and having two sidewalls; a plurality of junctions formed on a sidewall of the sidewalls of the respective active bodies; a dielectric layer having a plurality of open portions to expose the respective junctions and covering both sidewalls of the active bodies; a plurality of buried bit lines formed over the dielectric layer and partially filling the respective trenches; and a plurality of junction extension portions filling the respective open portions and formed between the buried bit lines and the junctions.

In accordance with yet another embodiment of the present invention, a semiconductor device includes: a plurality of active bodies isolated by a plurality of first trenches and having two sidewalls; a plurality of junctions formed in a sidewall of the sidewalls of the respective active bodies; a dielectric layer having a plurality of open portions to expose the respective junctions and covering both sidewalls of the active bodies; a plurality of buried bit lines formed over the dielectric layer and partially filling the respective trenches; a plurality of junction extension portions formed between the buried bit lines and the junctions and filling the respective open portions; a plurality of active pillars formed over the respective active bodies and isolated by a plurality of second trenches in a direction crossing the first trenches; a plurality of vertical word lines formed on sidewalls of the active pillars and extended in a direction crossing the buried bit lines; and a plurality of capacitors coupled to upper portions of the respective active pillars.

In accordance with still another embodiment of the present invention, a method for fabricating a semiconductor device includes: etching a semiconductor substrate and forming a plurality of bodies isolated by a plurality of trenches; forming a dielectric layer having a plurality of open portions to partially open a sidewall of the sidewalls of the respective bodies and covering the bodies; forming an impurity-doped first conductive layer on the entire surface such that the first conductive layer fills the open portions; forming a plurality of junctions in the sidewalls of the respective bodies contacting with the first conductive layer through a thermal treatment; forming a second conductive layer over the first conductive layer such that the second conductive layer fills the trenches; and recessing the second conductive layer and the first conductive layer to form a plurality of buried bit lines and junction extension portions such that the buried bit lines partially fill the respective trenches.

In accordance with still another embodiment of the present invention, a method for fabricating a semiconductor device includes: etching a semiconductor substrate and forming a plurality of bodies isolated by a plurality of trenches; forming a dielectric layer having a plurality of open portions to partially open a sidewall of the sidewalls of the respective bodies and covering the bodies; forming a first conductive layer on the entire surface such that the first conductive layer fills the trenches; recessing the first conductive layer and forming a plurality of buried bit lines which partially fill the trenches while reopening the open portions; forming a second conductive layer over the entire surface of the buried bit lines such that the second conductive layer fills the open portions and the trenches; recessing the second conductive layer and forming a plurality of junction extension portions; and forming a plurality of junctions in the sidewalls of the bodies contacting with the junction extension portions, through a thermal treatment.

BRIEF DESCRIPTION OF THE DRAWINGS

FIGS. 7A to 73 illustrate a method for forming an open portion in accordance with the embodiments of the present invention.

DETAILED DESCRIPTION

Figure 1:
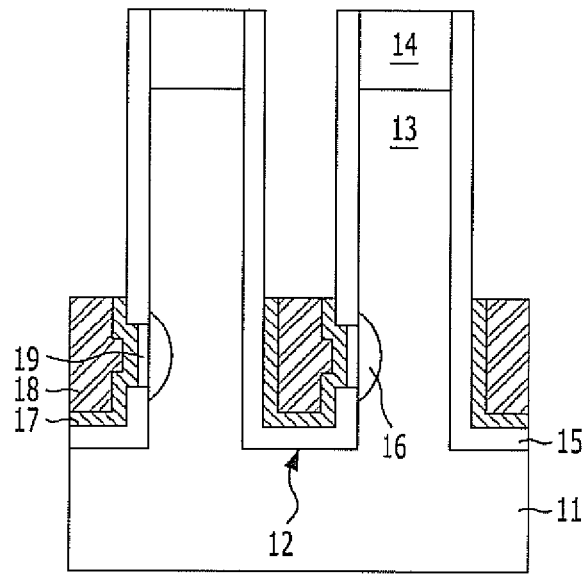
FIG. 1 illustrates a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
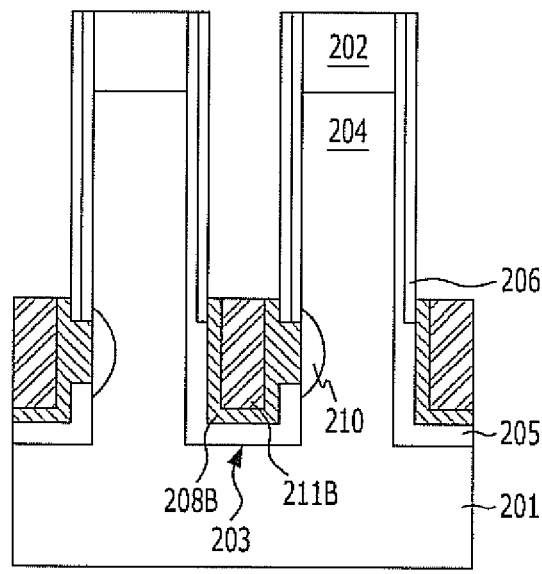
FIG. 2 illustrates a semiconductor device in accordance with a first embodiment of the present invention.

FIG. 2 illustrates a semiconductor device in accordance with a first embodiment of the present invention.

Referring to FIG. 2, a plurality of bodies 204 isolated by a plurality of trenches 203 are formed by etching a substrate 201. The substrate 201 includes a silicon substrate. Since the substrate 201 includes a silicon substrate, the bodies 204 are silicon bodies. Each of the bodies 204 extends vertically from the surface of the substrate 201. Each body 204 is an active region. The active region is where the channel, source, and drain of a transistor are formed. Each body 204 has two or more sidewalls facing each other in a lateral direction. Each body 204 is referred to as an active body.

A hard mask layer 202 is formed on each body 204. A dielectric layer is formed on both sidewalls of each body 204, the surface of a trench 203 between the respective bodies 204, and sidewalls of the hard mask layer 202. The dielectric layer includes a liner oxide layer 205 and a liner nitride layer 206. The liner oxide layer 205 is formed on both sidewalls of the body 204 and the surface of the substrate 201. The liner nitride layer 206 is formed on a part of the surface of the liner oxide layer 205. The above-described dielectric layer provides an open portion, which exposes a part of one sidewall of the body 204, and a junction 210 is formed in the portion of the body 204 that is exposed by the open portion.

A junction extension portion 208B is formed to fill the open portion and make contact with the junction 210. The junction extension portion 208B is an extended portion of the junction 210. The junction extension portion 208B is coupled to the junction 210 by filling the open portion. The junction extension portion 208B is also simultaneously formed on the surface of the liner oxide layer 205 and a portion of the surface of the liner nitride layer 206. The junction extension portion 208B includes a silicon layer, and more particularly, an impurity-doped polysilicon layer.

A buried bit line 211B partially fills the trench 203 over and in between the junction extension portion 208B. The surface height of the buried bit line 211B may be set to the same height as the junction extension portion 208B. The buried bit line 211B is formed of a low-resistance material. For example, the buried bit line 211B includes a metal layer or metal nitride. More specifically, the buried bit line 211B includes a titanium nitride (TiN).

FIGS. 3A to 3E illustrate a method for fabricating a semiconductor device in accordance with the first embodiment of the present invention.

Figure 3A:
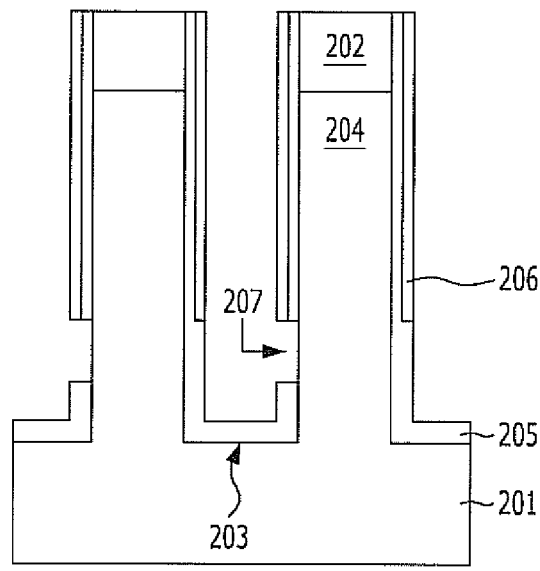
FIGS. 3A to 3E illustrate a method for fabricating a semiconductor device in accordance with the first embodiment of the present invention.

Referring to FIG. 3A, a plurality of bodies 204 isolated by a plurality of trenches 203 are formed on a substrate 201. The substrate 201 includes a silicon substrate. The substrate 201 is etched to a designated depth to form the plurality of trenches 203. The bodies 204 are formed by etching the substrate to form the trenches 203. Since the substrate 201 includes a silicon substrate, the bodies 204 are silicon bodies. Each of the bodies 204 extends vertically from the surface of the substrate 201. Each body 204 is used as an active region. The active region is where the channel, source, and drain of a transistor are formed. Each body 204 has two or more sidewalls facing in a lateral direction. Each body 204 is referred to as an active body.

A hard mask layer 202 is formed on each body 204. The hard mask layer 202 serves as an etch barrier when the substrate 201 is etched to form the trenches 203. The hard mask layer 202 includes a dielectric material such as oxide or nitride. In the first embodiment, nitride is used as the hard mask layer 202, and more specifically, the hard mask layer 202 includes a silicon nitride.

A dielectric layer is formed on both sidewalls of the body 204, the surface of a trench 203 between the respective bodies 204, and sidewalls of the hard mask layer 202. The dielectric layer includes a liner oxide layer 205 and a liner nitride layer 206. The liner oxide layer 205 is formed on both sidewalls of the body 204 and the surface of the substrate 201. The liner nitride layer 206 is formed on a part of the surface of the liner oxide layer 205 above an open portion 207.

A part of the liner oxide layer 205 is removed to form the open portion 207. The open portion 207 has a one side contact (OSC) structure, which selectively exposes one of the sidewalls of the body 204. The open portion 207 is formed by removing part of the dielectric layer along the extending direction of the body 204 and exposing a part of the sidewall of the body 204.

Figure 3B:
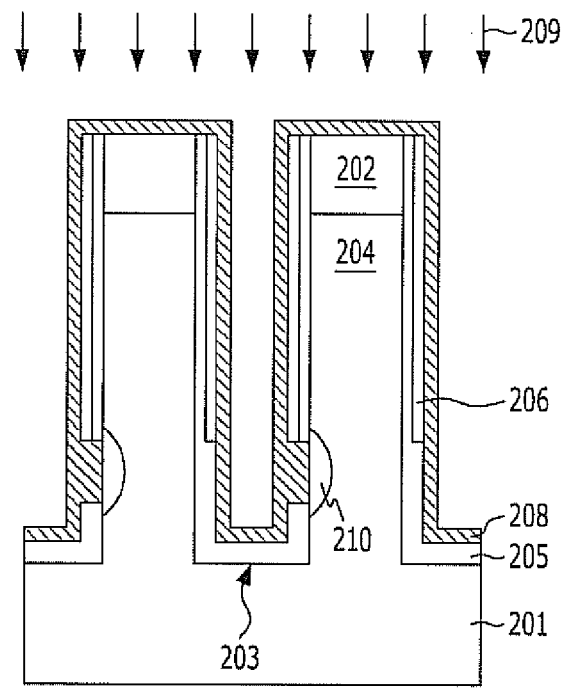

Referring to FIG. 3B, a first conductive layer 208 is formed along the entire structure including the bodies 204, the hard mask layers 202, and the trenches 203. The first conductive layer 208 includes a silicon layer. More specifically, the first conductive layer 208 includes a doped polysilicon layer doped with, for example, either Phosphorus (P) or Arsenic (As). For example, the first conductive layer 208 is formed to a thickness of 50 to 100 Å by using a P-doped polysilicon layer. The first conductive layer 208 may be formed by using atomic layer deposition (ALD) or chemical vapor deposition (CVD). The first conductive layer 208 may serve as an extended portion of a junction formed by a subsequent process. For example, the body 204 and the first conductive layer 208 are coupled to each other.

Subsequently, a thermal treatment 209 is performed. Accordingly, the impurities doped in the first conductive layer 208 are thermally diffused into the body 204 to form a junction 210 in a part of the sidewall of the body 204 near the opening 207. The thermal treatment 209 is performed by rapid thermal annealing (RTA), and RTA is performed at a temperature of 900° C. or more for 10 seconds or less. During RTA, an oxygen ($O_2$) atmosphere may be used.

The impurities doped in the junction 210 have a doping concentration of $1 \times 10^{20}$ atoms/cm$^3$ or more. In order to obtain such a doping concentration, the concentration of impurities of the first conductive layer 208 is controlled when the first conductive layer 208 is formed.

After the thermal process, the junction 210 includes P or As impurities doped therein. Accordingly, the junction 210 becomes an N-type junction. When a thermal-diffusion method is applied, the side diffusion depth of the junction 210 may be controlled to be a short depth, and, as described above, the concentration of the impurities may also be controlled. The junction 210 may serve as a source or a drain of a vertical channel transistor.

When the above-described thermal treatment 209 is performed, the impurities are diffused into the sidewall of the body 204 through the open portion 207. The diffusion of the impurities into the body 204 is substantially prevented in portions of the body 204 that are covered by the liner oxide layer 205 and the liner nitride layer.

Figure 3C:
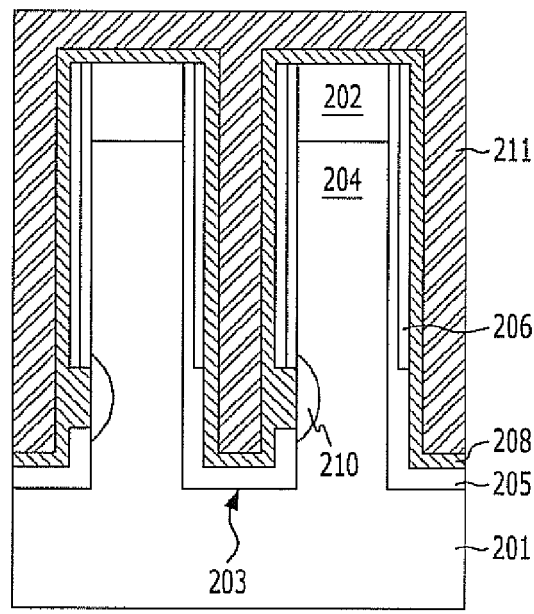

Referring to FIG. 3C, a second conductive layer 211 is formed on the first conductive layer 208 to fill the trench 203. The second conductive layer 211 is used as a buried bit line and is formed of a low-resistance material. For example, the second conductive layer 211 includes a metal layer or metal nitride, such as TIN.

Figure 3D:
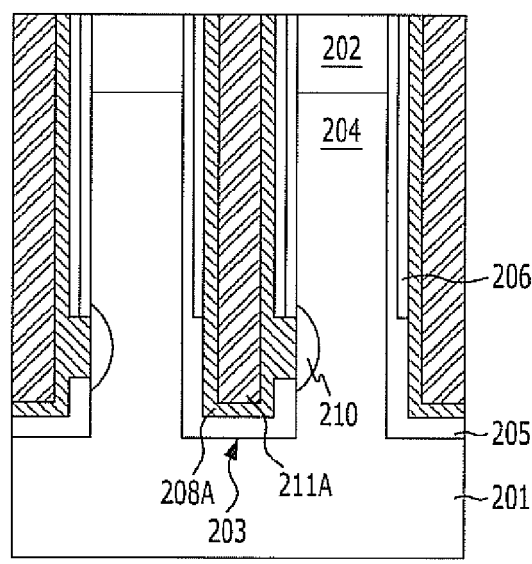

Referring to FIG. 3D, the second conductive layer 211 and the first conductive layer 208 are planarized. The planarization is performed until the surface of the hard mask layer 202 is exposed. For example, a chemical mechanical polishing (CMP) process is applied and performed for planarization. Through the planarization process, a second conductive layer pattern 211A and a first conductive layer pattern 208A are formed in the trenches 203, but are not formed above the hard mask layer 202.

Figure 3E:
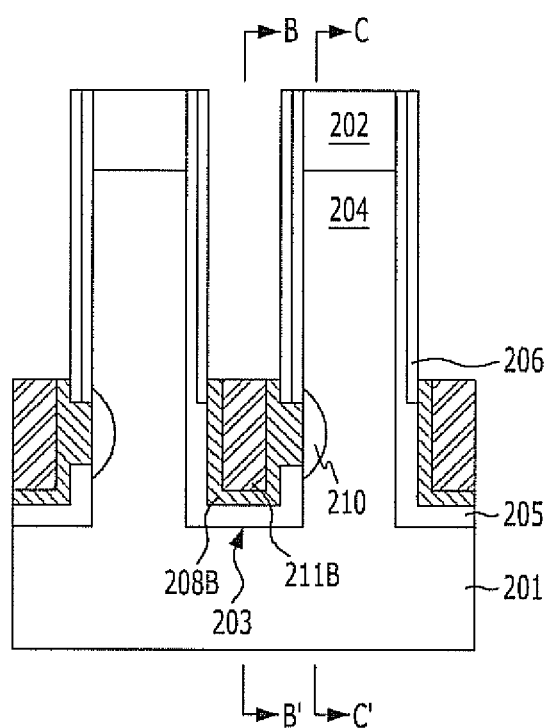

Referring to FIG. 3E, an etch back process is performed. The second conductive pattern 211A and the first conductive pattern 208A are simultaneously etched by the etch back process. Since the first conductive layer pattern 208A includes a polysilicon layer and the second conductive layer pattern 211A includes TIN, the etch back process may be performed by using a gas mixture selected from the group consisting of $Cl_2/Ar$, $Cl_2/He$, $Cl_2/BCl_3/Ar$, and $Cl_2/BCl_3/He$. Furthermore, during the etch back process, a pressure is set to 5-20 mTorr, a plasma source power is set to 400-800 W, a bias power is set to 0-100 W, and an electrode temperature is set to 40-60° C.

Through the etch back process, the first conductive pattern 208A becomes a junction extension portion 208B, and the second conductive pattern 211A becomes a buried bit line 211B.

During the etch back process, the first conductive pattern 208A is etched so that the junction extension portion 208B has a height that at least fill the open portion. More specifically, after the etch back process, the junction extension portion 208B fills the open portion 207 and partially fills the trench 203. The junction extension portion 208B becomes an extended portion of the junction 210. The junction extension portion 208B is coupled to the junction by filling the open portion 207, and is also formed on the bottom of the liner oxide layer 205 and some of the sidewalls of the liner oxide layer 205 and some of the sidewalls the liner nitride layer 206.

The buried bit line 211B partially fills the trench 203 over and in between the junction extension portion 208B. The surface height of the buried bit line 211B may be set to the same height as the junction extension portion 208B.

In accordance with the first embodiment of the present invention, the buried bit line 211B is coupled to the body 204 through the junction extension portion 208B. Since a metal or metal nitride is used to form the buried bit line 211B, the resistance of the buried bit line may be reduced.

In the first embodiment, since the etch back process that forms the junction extension portion 208B is performed simultaneously during the etch back process that forms the buried bit line 211B, a loss of the junction 210 is substantially prevented. In addition, since the junction extension portion 208B protects the junction 210, the junction 210 is substantially prevented from being damaged during the formation of the buried bit line 211B.

In accordance with the first embodiment of the present invention, the second conductive layer pattern 211A and the first conductive layer pattern 208A are simultaneously etched back to form the buried bit line 211B and the junction extension portion 208B. Therefore, the process that forms the junction extension portion 208B may be simplified without causing damage to the junction 210.

FIGS. 4A to 4E illustrate a method for fabricating a semiconductor device in accordance with a second embodiment of the present invention.

Figure 4A:
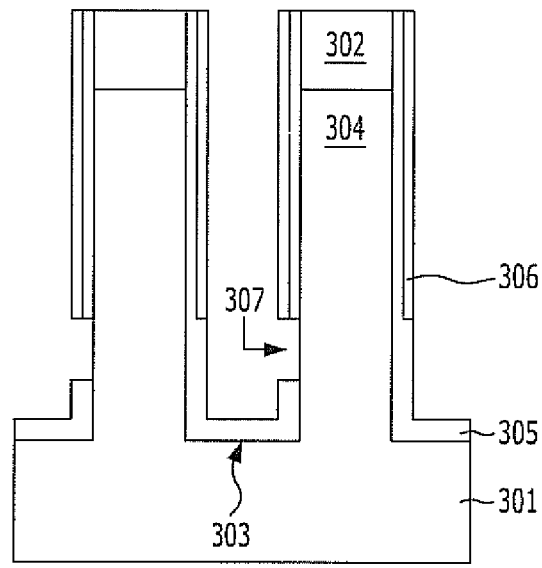
FIGS. 4A to 4E illustrate a method for fabricating a semiconductor device in accordance with a second embodiment of the present invention.

Referring to FIG. 4A, a plurality of bodies 304 isolated by a plurality of trenches 303 are formed on a substrate 301. The substrate 301 may include a silicon substrate. The substrate 301 is etched to a designated depth to form the plurality of trenches 303. Since the substrate 301 may include a silicon substrate, the bodies 304 are silicon bodies. Each of the bodies 304 extends vertically from the substrate 301. Each body 304 is used as an active region. Each body 304 has two or more sidewalls facing in a lateral direction. Each body 304 is referred to as an active body.

A hard mask layer 302 is formed on each body 304. The hard mask layer 302 serves as an etch barrier when the substrate 301 is etched to form the trenches 303. The hard mask layer 302 includes a dielectric material such as oxide or nitride. In the second embodiment, nitride is used as the hard mask layer 302, and more specifically, the hard mask layer 302 includes a silicon nitride.

A dielectric layer is formed on both sidewalls of the body 304, the surface of a trench 303 between the respective bodies 304, and sidewalls of the hard mask layer 302. The dielectric layer includes a liner oxide layer 305 and a liner nitride layer 306. The liner oxide layer 305 is formed on both sidewalls of the body 304 and the surface of the substrate 301. The liner nitride layer 306 is formed on a part of the surface of the liner oxide layer 305 above an open portion 307.

A part of the liner oxide layer 305 is removed to form the open portion 307. The open portion 307 has an OSC structure, which selectively exposes one of the sidewalls of the body 304. The open portion 307 is formed by removing part of the dielectric layer along the extending direction of the body 304 and exposing a part of the sidewall of the body 304.

Figure 4B:
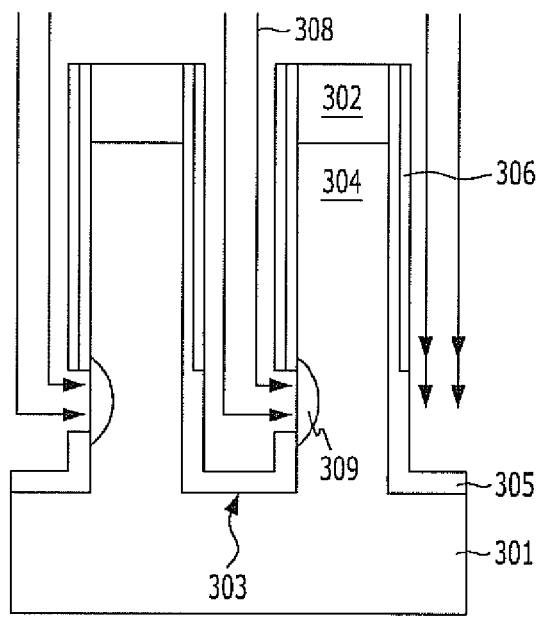

Referring to FIG. 4B, a junction 309 is formed in the side wall of the body 304 near the open portion 307 after the open portion 307 is formed. As a method of forming the junction 309, tilt implant or plasma doping may be performed. In the second embodiment, plasma doping 308 is applied. Impurities doped in the open portion 307 to form the junction 309 have a doping concentration of $1 \times 10^{20}$ atoms/cm$^3$ or more. For example, the junction 309 is doped with either P or As. Accordingly, the junction 309 becomes an N-type junction. When the plasma doping 308 is applied, the side diffusion depth of the junction 309 may be controlled to be a short depth, and the concentration of the plasma doping may also be controlled. The junction 309 may serve as a source or drain of a vertical channel transistor.

Figure 4C:
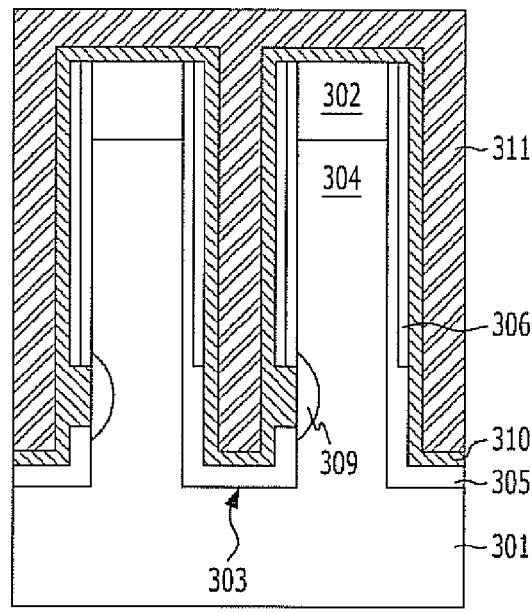

Referring to FIG. 4C, a first conductive layer 310 is formed along the entire structure including the bodies 304, the hard mask layers 302, and the trenches 303. The first conductive layer 310 includes a silicon layer. More specifically, the first conductive layer 310 includes a doped polysilicon layer doped with, for example, either P or As. For example, the first conductive layer 310 is formed to a thickness of 50 to 100 Å by using a P-doped polysilicon layer. The first conductive layer 310 is formed by ALD or CVD. Accordingly, the first conductive layer 310 may cover the entire structure and also fill the open portion. The first conductive layer 310 may serve as an extended portion of the junction 309. More specifically, since the body 304 is a silicon substrate and the first conductive layer 310 includes a polysilicon layer, the junction 309 and the first conductive layer 310 are coupled to each other.

A second conductive layer 311 is formed on the first conductive layer 310 to fill the trench 303. The second conductive layer 311 is used as a buried bit line and is formed of a low-resistance material. For example, the second conductive layer 311 includes a metal layer or metal nitride, such as TiN.

Figure 4D:
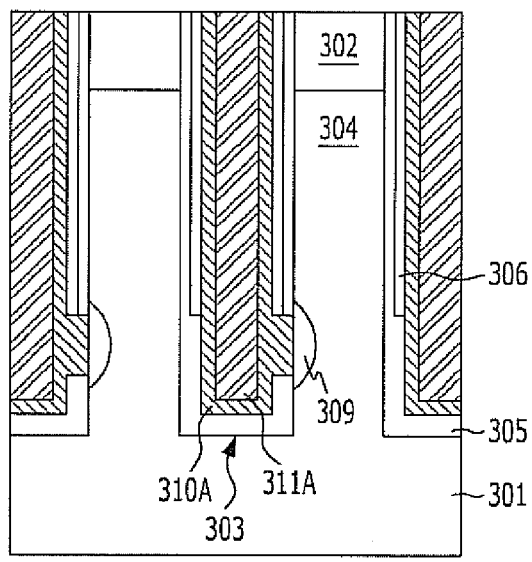

Referring to FIG. 4D, the second conductive layer 311 and the first conductive layer 310 are planarized. The planarization is performed until the surface of the hard mask layer 302 is exposed. Through the planarization process, a second conductive layer pattern 311A and a first conductive layer pattern 310A are formed inside the trench 303, but are not formed above the hard mask layer 302. For example, a CMP process is applied and performed for planarization.

Figure 4E:
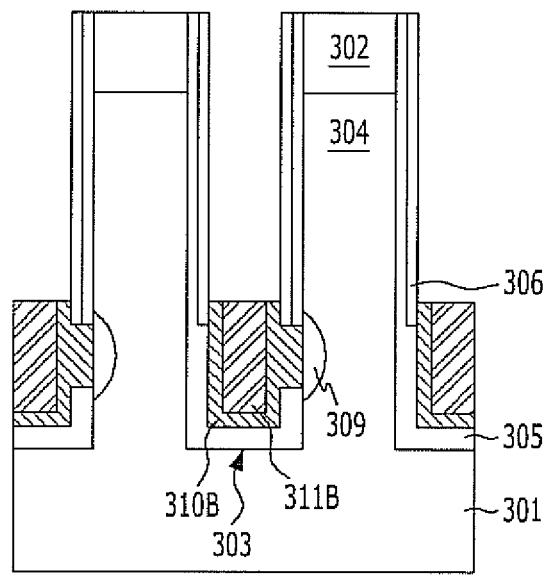

Referring to FIG. 4E, an etch back process is performed. The second conductive pattern 311A and the first conductive pattern 310A are simultaneously etched through the etch back process. Since the first conductive layer pattern 310A includes a polysilicon layer and the second conductive layer pattern 311A includes TiN, the etch back process is performed by using a gas mixture selected from the group consisting of Cl$_2$/Ar, Cl$_2$/He, Cl$_2$/BCl$_3$/Ar, and Cl$_2$/BCl$_3$/He. Furthermore, during the etch back process, a pressure is set to 5-20 mTorr, a plasma source power is set to 400-800 W, a bias power is set to 0-100 W, and an electrode temperature is set to 40-60° C.

Through the etch back process, the first conductive pattern 310A becomes the junction extension portion 310B, and the second conductive pattern 311A becomes the buried bit line 311B.

During the etch back process, the first conductive pattern 310A is etched so that the junction extension portion 310B has a height that at least fills the open portion. More specifically, after the etch back process, the junction extension portion 310B fills the open portion 207 and partially fills the trench 303. The junction extension portion 310B becomes an extended portion of the junction 309. The junction extension portion 310B is coupled to the junction 309 by filling the open portion, and the junction extension portion 310B is also formed on the bottom of the liner oxide layer 305 and some of the sidewalls of the liner oxide layer and some of the sidewalls of the liner nitride layer 306.

The buried bit line 311B partially fills the trench 303 over and in between the junction extension portion 310B. The surface height of the buried bit line 311B may be set to the same height as the junction extension portion 310B.

In accordance with the second embodiment of the present invention, the buried bit line 311B is coupled to the body 304 through the junction extension portion 310B. Since a metal layer or metal nitride is used to form the buried bit line 311B, the resistance of the buried bit line 311B may be reduced.

In the second embodiment, since as the etch back process that forms the junction extension portion 310B is performed simultaneously during the etch back process that forms the buried bit line 311B, a loss of the junction 309 is substantially prevented. In addition, since the junction extension portion 310B protects the junction 309, the junction 309 is substantially prevented from being damaged during the formation of the buried bit line 211B.

In accordance with the second embodiment of the present invention, the second conductive layer pattern 311A and the first conductive layer pattern 310A are simultaneously etched back to form the buried bit line 311B and the junction extension portion 310B. Therefore, the process that forms the junction region may be simplified without causing damage to the junction 309.

Figure 5:
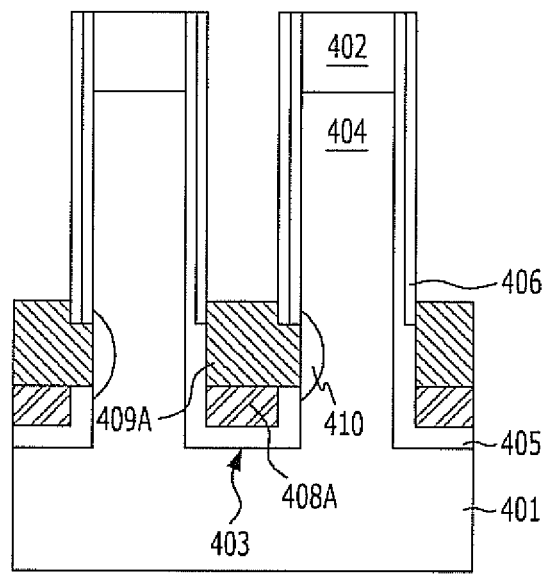
FIG. 5 illustrates a semiconductor device in accordance with a third embodiment of the present invention.

FIG. 5 illustrates a semiconductor device in accordance with a third embodiment of the present invention.

Referring to FIG. 5, a plurality of bodies 404 isolated by a plurality of trenches 403 are formed on a substrate 401. The substrate 401 includes a silicon substrate. Since the substrate 401 includes a silicon substrate, the bodies 404 are silicon bodies. Each of the bodies 404 extends vertically from the surface of the substrate 401. Each body 404 is used as an active region. Each body 404 has two or more sidewalls facing each other in a lateral direction. Each body 404 is referred to as an active body.

A hard mask layer 402 is formed on each body 404. A dielectric layer is formed on both sidewalls of each body 404, the surface of a trench 403 between the respective bodies 404, and sidewalls of the hard mask layer 402. The dielectric layer includes a liner oxide layer 405 and a liner nitride layer 406. The liner oxide layer 405 is formed on both sidewalls of the body 404 and the surface of the substrate 401. The liner nitride layer 406 is formed on a part of the surface of the liner oxide layer 405. The above-described dielectric layer provides an open portion, which exposes a part of one sidewall of the body 404, and a junction 410 is formed in the body 404 that is exposed by the open portion.

A buried bit line 408A partially fills the trench 403. The surface height of the buried bit line 408A is set to be lower than the bottom of the open portion. The buried bit line 408A is formed of a low-resistance material. For example, the buried bit line 408A includes a metal layer or metal nitride. More specifically, the buried bit line 408A includes TiN.

A junction extension portion 409A is formed on the buried bit line 408A to at least fill the open portion while also contacting with the junction 410. The junction extension portion 409A is an extended portion of the junction 410. The junction extension portion 409A is coupled to the junction 410 by filling the open portion. The junction extension portion 409A includes a silicon layer, or more specifically, a polysilicon layer having impurities doped therein. The buried bit line 408A and the junction 410 are electrically coupled to each other through the junction extension portion 409A.

FIGS. 6A to 6E illustrate a method for fabricating a semiconductor device in accordance with the third embodiment of the present invention.

Figure 6A:
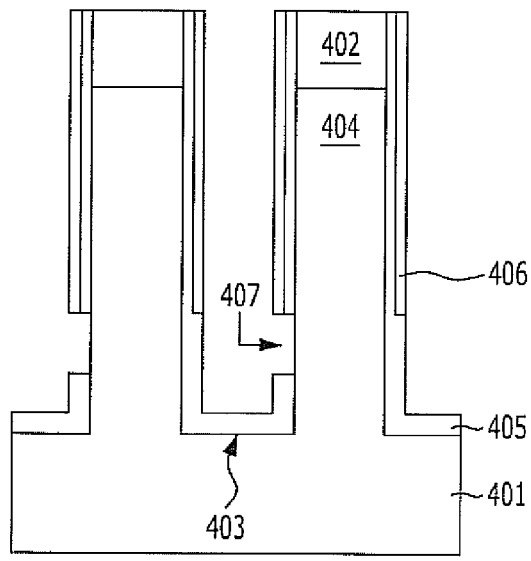
FIGS. 6A to 6E illustrate a method for fabricating a semiconductor device in accordance with the third embodiment of the present invention.

Referring to FIG. 6A, a plurality of bodies 404 isolated by a plurality of trenches 403 are formed on a substrate 401. The substrate 401 includes a silicon substrate. The substrate 401 is etched to a designated depth to form the plurality of trenches 403. The bodies 404 and the trenches 403 are formed by etching the substrate. Since the substrate 401 includes a silicon substrate, the bodies 404 are silicon bodies. Each of the bodies 404 extends vertically from the surface of the substrate 401. Each body 404 is used as an active region. Each body 404 has two or more sidewalls facing in a lateral direction. Each body 404 is also referred to as an active body.

A hard mask layer 402 is formed on each body 404. The hard mask layer 402 serves as an etch barrier when the substrate 401 is etched to form the trenches 403. The hard mask layer 402 includes a dielectric material such as oxide or nitride. In the third embodiment, nitride is used as the hard mask layer 202, and more specifically, the hard mask layer 402 includes a silicon nitride.

A dielectric layer is formed on both sidewalls of the body 404, the surface of a trench 203 between the respective bodies 404, and sidewalls of the hard mask layer 402. The dielectric layer includes a liner oxide layer 405 and a liner nitride layer 406. The liner oxide layer 405 is formed on both sidewalls of the body 404 and the surface of the substrate 401. The liner nitride layer 406 is formed on a part of the surface of the liner oxide layer 405 above an open portion 407.

A part of the liner oxide layer 405 is removed to form the open portion 407. The open portion 407 has an OSC structure, which selectively exposes one of the sidewalls of the body 404. The open portion 407 removes part of the liner oxide layer 405 along the extending direction of the body 404 and exposes a part of the sidewall of the body 404.

Figure 6B:
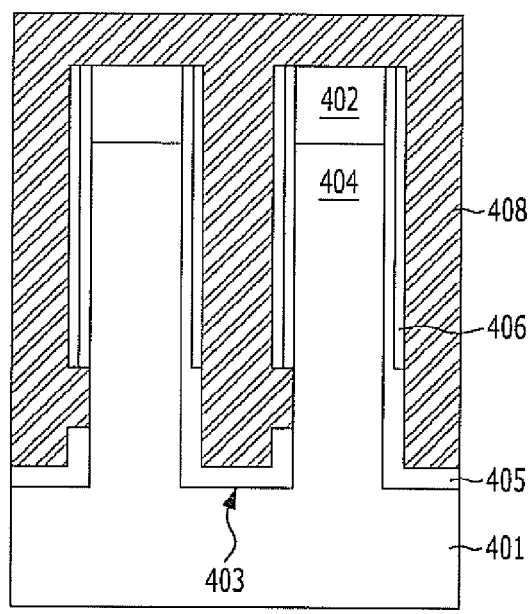

Referring to FIG. 6B, a first conductive layer 408 is formed along the entire structure including the bodies 404, the hard mask layers 402, and the trenches 403. The first conductive layer 408 fills the trench 403. For example, the first conductive layer 408 includes a metal layer or metal nitride, such as TIN. The first conductive layer 408 is formed of a low-resistance material and is used as a buried bit line.

Figure 6C:
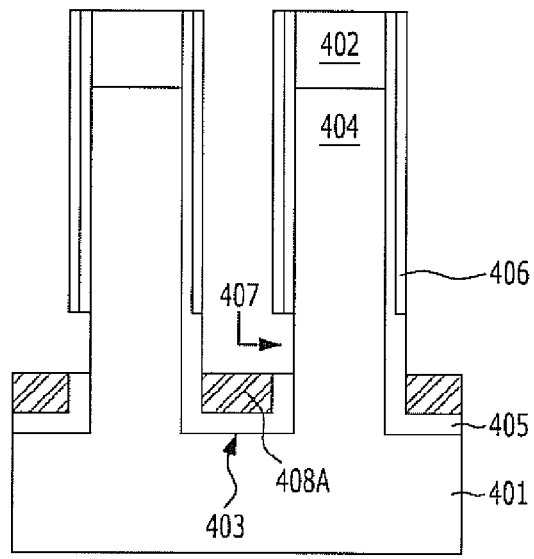

Referring to FIG. 6C, the first conductive layer 408 is planarized and then etched back. The planarization is performed until the surface of the hard mask layer 402 is exposed. For example, a CMP process is applied and performed. After the planarization and etching process, a first conductive layer pattern 408A remains to partially fill the inside of the trench 403. After the etch back process, the first conductive layer pattern 408A has a height lower than the bottom of the open portion 407.

The first conductive layer pattern 408A becomes a buried bit line. Hereinafter, the first conductive layer pattern 408A is referred to as a buried bit line 408A.

Figure 6D:
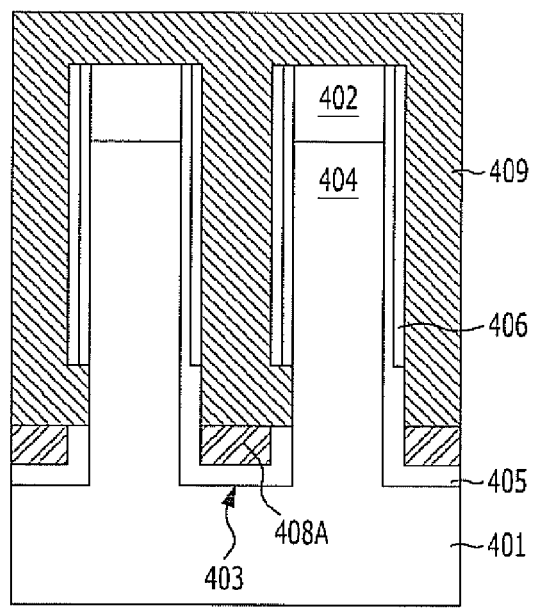

Referring to FIG. 6D, a second conductive layer 409 is formed to fill the trench 403 over the buried bit line 408A and cover the entire structure including the bodies 404 and the hard mask layers 402. The second conductive layer 409 includes a silicon layer. More specifically, the second conductive layer 409 includes a polysilicon layer that is doped with either P or As. The second conductive layer 409 is formed by performing ALD or CVD. The second conductive layer 409 may serve as an extended portion of the junction.

Figure 6E:
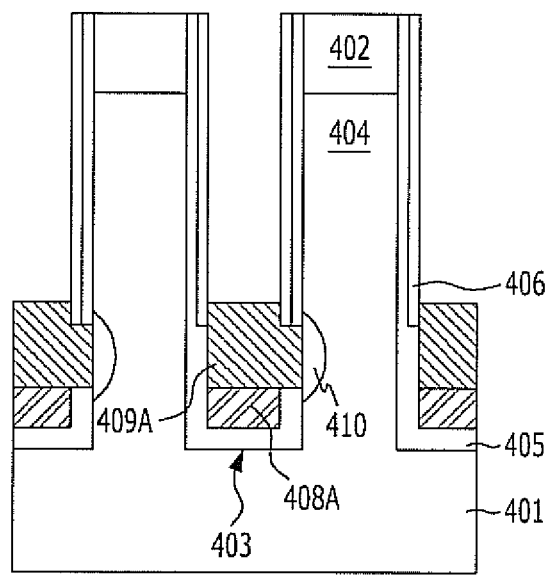

Referring to FIG. 6E, the second conductive layer 409 is planarized and then etched back. The planarization is performed until the surface of the hard mask layer 402 is exposed. For example, a CMP process is applied. After the planarization and etching process, a second conductive layer pattern 409A partially fills the inside of the trench 403 and remains over the buried bit line 408A. After the etch back process, the second conductive pattern 409A has a height that at least fills the open portion 407.

The second conductive layer pattern 409A serves as a junction extension portion. Hereinafter, the second conductive layer pattern 409A is referred to as the junction extension portion 409A.

Subsequently, a thermal treatment is performed. Accordingly, the impurities doped in the junction extension portion 409A are thermally diffused in the body 404 through the open portion 407 to form a junction 410 in a part of the sidewall of the body 404 around the open portion 407. The thermal treatment is performed by RTA, and RTA is performed at a temperature of 900° C. or more for 10 seconds or less. During RTA, an oxygen ($O_2$) atmosphere may be used.

The impurities doped in the junction 410 have a doping concentration of $1 \times 10^{20}$ atoms/cm$^3$ or more. In order to obtain such a doping concentration, the concentration of the impurities is controlled when the second conductive layer is formed.

For example, the junction 410 is doped with either P or As after the thermal treatment process. Accordingly, the junction 410 becomes an N-type junction. When a thermal-diffusion method is applied, the side diffusion depth of the junction 410 may be controlled to be a short depth, and the concentration of the impurities may also be controlled. The junction 410 may serve as a source or drain of a vertical channel transistor.

When the above-described thermal treatment is performed, the impurities are diffused into a portion of the sidewall of the body 404 that is in contact with the junction extension portion 409A. The diffusion of the impurities into the body 404 is substantially prevented in portions of the body 404 that are covered by the dielectric layers.

In accordance with the third embodiment of the present invention, the buried bit line 408A is coupled to the junction 410 through the junction extension portion 409A. As the buried bit line 408A is formed of a metal layer or metal nitride, the resistance of the buried bit line may be reduced.

In the third embodiment of the present invention, since the junction 410 is formed after the etch back process that forms the junction extension portion 409A and the etch back process that forms the buried bit line 408A is performed, a loss of the junction 410 is substantially prevented.

More specifically, since the junction 410 is formed after the buried bit line 408A and the junction extension portion 409A are formed, the process of forming the junction region may be simplified without causing damage to the junction 410.

FIGS. 7A to 7J illustrate a method for forming the open portion in accordance with the embodiments of the present invention.

Figure 7A:
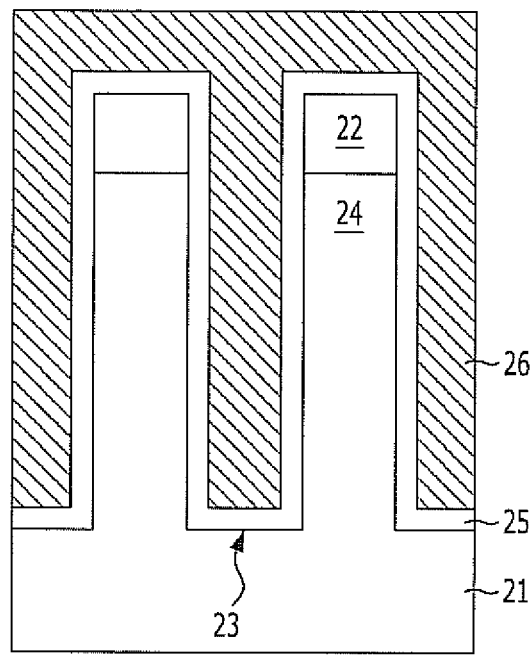

Referring to FIG. 7A, a hard mask layer 22 is formed on a substrate 21. The substrate 21 includes a silicon substrate. The hard mask layer 21 includes a nitride. Furthermore, the hard mask layer 22 may have a multilayer structure including an oxide and a nitride. For example, the hard mask layer 22 may include a hard mask nitride (HM nitride) and a hard mask oxide (HM oxide) that are sequentially stacked. Furthermore, the hard mask layer 22 may include a HM nitride, a HM oxide, a hard mask silicon oxynitride (HM SiON), and a hard mask carbon (HM carbon) that are sequentially stacked. When a HM nitride is included, a pad oxide may be further formed between the substrate 21 and the hard mask layer 22. The hard mask layer 22 is formed by using a photoresist pattern, which is not illustrated.

A trench etch process is performed using the hard mask layer 22 as an etch barrier. For example, the substrate 21 is etched to a designated depth to form a plurality of trenches 23 using the hard mask layer as an etch barrier. The plurality of trenches 23 isolate and define a plurality of bodies 24. Each of the bodies 24 includes an active region where a transistor is formed. Each body 24 has two sidewalls. The etch process includes an anisotropic etch process. When the substrate 21 is a silicon substrate, the anisotropic etch process may include a plasma dry etch process in which $Cl_2$ or HBr gas is independently used or a mixture of the two gases is used.

As part of a dielectric layer, a first liner layer 25 is formed. The first liner layer 25 includes an oxide, such as silicon oxide.

On the first liner 25, a sacrifice layer 26 is formed to at least fill the trenches 23 between the respective bodies 24. The sacrifice layer 26 includes undoped polysilicon or amorphous silicon.

Figure 7B:
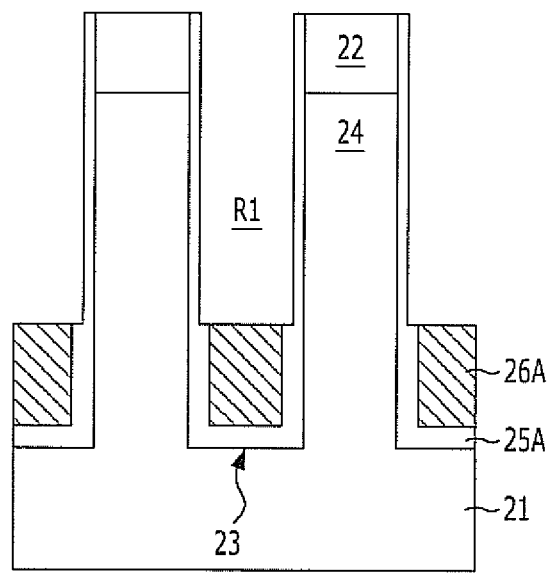

Referring to FIG. 7B, the sacrifice layer 26 is planarized until the surface of the hard mask layer 22 is exposed. The planarization of the sacrifice layer 26 includes a CMP process. Subsequently, an etch-back process is performed. After the etch-back process, a sacrifice layer pattern 26A, providing a first recess R1, is formed. During the CMP process, the first liner layer 25 on the hard mask layer 24 may be polished. Through the CMP process and the etch back process, a first liner layer pattern 25A covering both sidewalls of the hard mask layers 22 and the bodies 24 is formed. The first liner layer pattern 25A also covers the bottom of the trench 23.

The thickness of the first liner layer pattern 25A above the sacrifice layer pattern 26A is slimmed using a wet etch process. As the amount of wet etch time is controlled, the first liner layer pattern 25A remains a designated thickness at the sidewalls of the bodies 24.

Figure 7C:
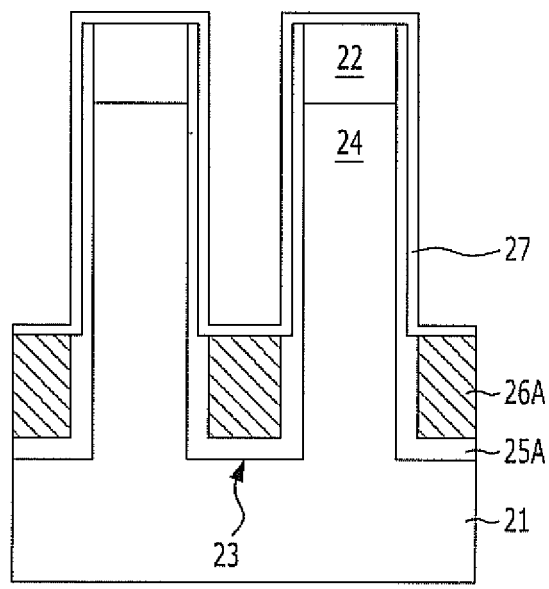

Referring to FIG. 7C, a second liner layer 27 is formed as another part of the dielectric layer on the entire surface including the bodies 24, the hard mask layer 22, and the sacrifice layer pattern 26A. The second liner layer 27 includes a nitride, such as silicon nitride. The second liner layer 27 is formed to the same thickness as the slimmed portion of the first liner layer pattern 25A.

Figure 7D:
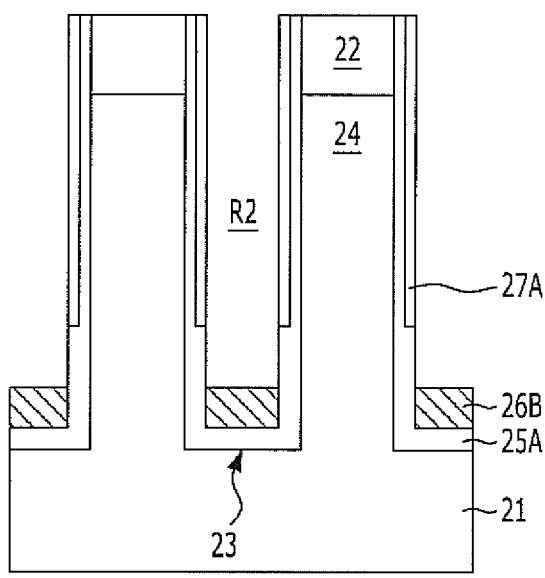

Referring to FIG. 7D, the second liner layer 27 is selectively etched. Accordingly, a second liner layer pattern 27A is formed on the slimmed region of the first liner layer pattern 25A. In order to form the second liner layer pattern 27A, an etch-back process may be applied.

Using the second liner layer pattern 27A as an etch barrier, the sacrifice layer pattern 26A is further recessed to a designated depth. Accordingly, the sacrifice layer pattern 26A is further recessed to expose a part of the surface of the first liner layer pattern 25A. The remainder of the sacrifice layer pattern 26A not recessed forms the second recess R2 and is represented by reference numeral 26B. When the sacrifice layer pattern 26B includes a polysilicon, an etch-back process is used to further recess the sacrifice layer pattern 26A.

Figure 7E:
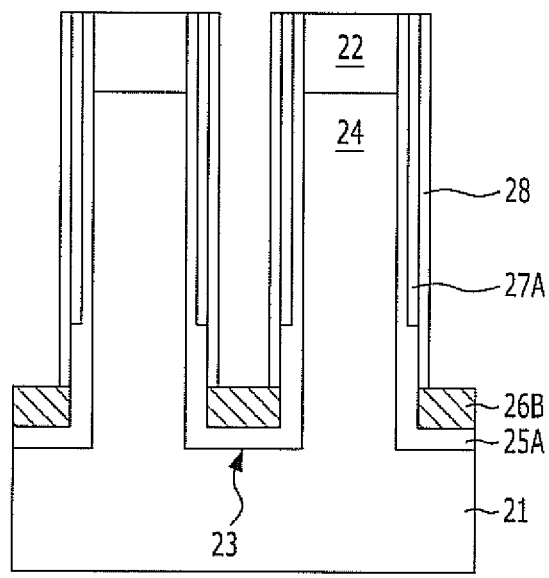

Referring to FIG. 7E, a metal nitride is formed on the entire surface including the bodies 22, the hard mask layer 24 and the sacrifice layer pattern 26A. Then, a spacer etch process is performed to form a sacrifice spacer 28. The sacrifice spacer 28 is formed on both sidewalls of the body 22. For example, the sacrifice spacer 28 includes TiN.

Figure 7F:
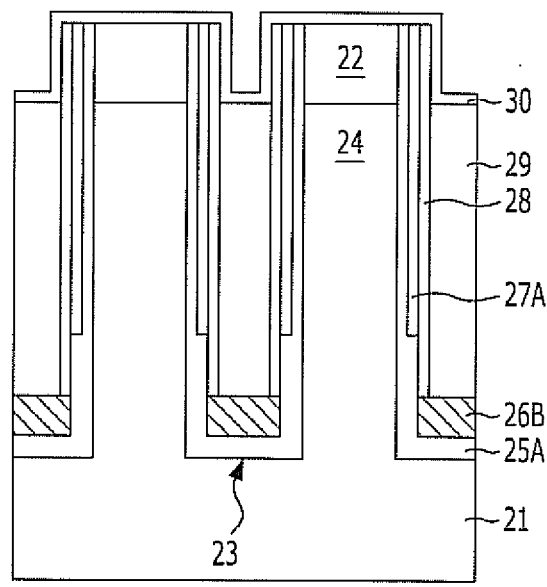

Referring to FIG. 7F, a gap-fill layer 29 is formed to fill the trenches 23. The fill layer 29 may include an oxide. The fill layer 28 may also include a spin-on dielectric (SOD) layer.

The gap-fill layer 29 is planarized and then etched back. Accordingly, a recessed gap-fill layer 29 is formed.

A third liner layer 30 is formed on the entire surface including the hard mask layer 22 and the gap-fill layer 29. The third liner layer 30 includes undoped polysilicon.

Figure 7G:
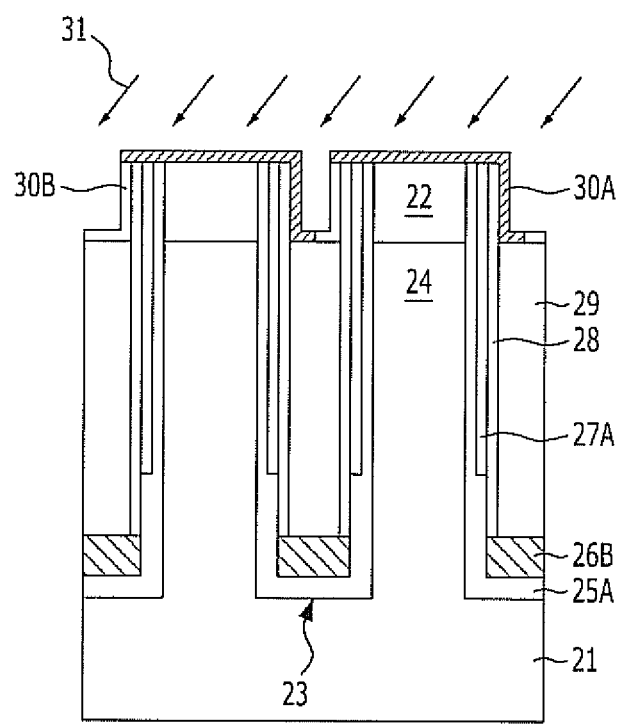

Referring to FIG. 7G, a tilt implant 31 is performed.

The tilt implant 31 is performed by ion implanting a dopant at a designated tilt. The dopant is implanted into a part of the third liner layer 30.

The tilt implant 31 is performed at a designated angle. The designated angle includes angles ranging from about 5-30 degrees. Because of the angle of the tilt implant 31, the tilt implant 31 does not strike some of the third liner layer 30 that is protected by the hard mask layer 22. Therefore, although a part of the third liner layer 30 is doped, the other part remains undoped. For example, the undoped part may be adjacent to the left side of the hard mask layer 22. For example, the ion-implanted dopant may include a P-type dopant, more specifically, boron. In order to ion implant boron, $BF_2$ may be used as a dopant source.

A part of the third liner layer, which is formed on the upper surface of the hard mask layer 22 by the tilt implant 31, and a part of the third liner layer, for example, adjacent to the right side of the hard mask layer 22, is a doped third liner layer 30A. A part of the third liner layer into which a dopant is not implanted is an undoped third liner layer 30B.

Figure 7H:
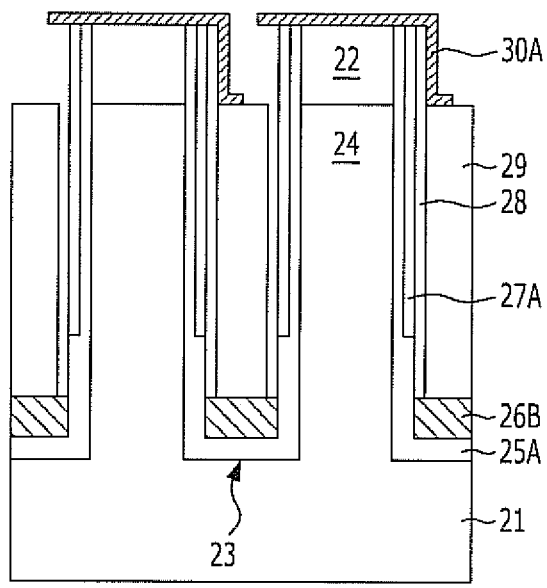

Referring to FIG. 7H, the undoped third liner layer 30B is removed. The undoped third liner layer 30B is removed by a wet etching or wet cleaning process. Undoped polysilicon used as the third liner layer and doped polysilicon have different etching speeds. In particular, undoped polysilicon has a high wet etching speed. Therefore, a chemical having a high selectivity is capable of wet etching, for example, only undoped polysilicon and selectively removes the undoped polysilicon. When the undoped third liner layer 30B is removed, for example, only the doped third liner layer 30A remains.

The sacrifice spacer 28 on the side of the body 22 where the undoped third liner layer 30B was removed is removed. Accordingly, a gap between the gap-fill layer 29 and the second liner pattern 27A is formed where one of the sacrifice spacers 28 was removed. The sacrifice spacer 28 is removed using wet etching. Accordingly, one sacrifice spacer 28 remains on each body 22.

Figure 7I:
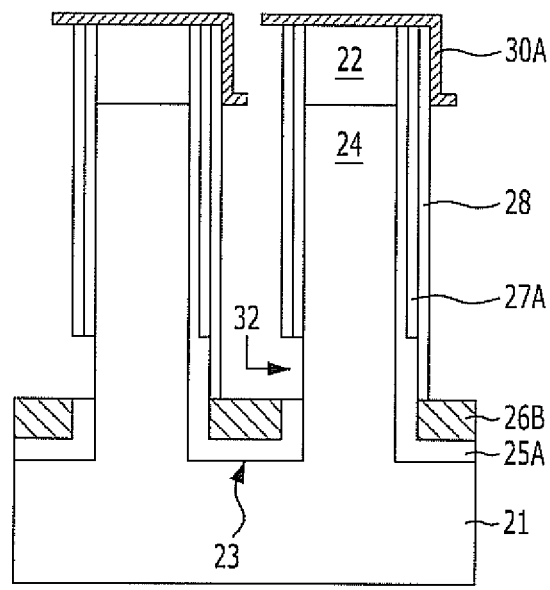

Referring to FIG. 7I, the gap fill layer 29 is removed. Subsequently, a cleaning process is performed to expose a part of the sidewall of the body 22.

The cleaning process includes wet cleaning. The wet cleaning is performed by using, for example, HF, or buffered oxide etchant (BOE). When the wet cleaning is used, the first liner layer pattern 25A may be selectively removed without damaging the sacrifice layer 26B, the sacrifice spacer 28, and the second liner layer pattern 27A.

As shown in FIGS. 7A-7H, the hard mask layer 24, the first liner layer pattern 25A, the second liner layer pattern 27A, the sacrifice layer 26B, and the sacrifice spacer 28 are collectively referred to as 'dielectric layer'. Through the process shown in FIGS. 7A-7H, the dielectric layer provides an open portion 32 which exposes a part of any one sidewall of the body 24 after the wet cleaning process is performed.

The open portion 32 corresponds to the open portion illustrated and described in the first, second, and third embodiments of the present invention.

Figure 7J:
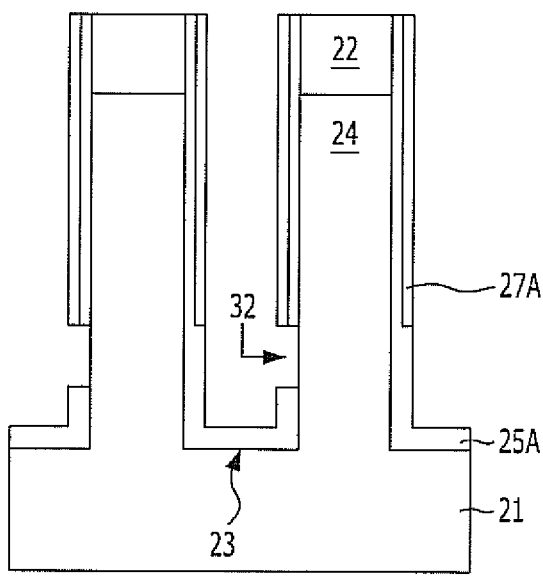

Referring to FIG. 7J, the doped third liner layer 30A and the sacrifice layer 26B are removed. Since the doped third liner layer 30A and the sacrifice layer 26B are both formed of polysilicon, they are simultaneously removed. After the doped third liner layer 30A and the sacrifice layer 26B are removed, the sacrifice spacer 28 is removed.

FIGS. 8A to 8E illustrate the method for fabricating a semiconductor device after the buried bit line is formed, in accordance with the embodiments of the present invention. FIGS. 8A to 8E include cross-sectional views taken along a line B-B' and a line C-C' of FIG. 3E, respectively.

Figure 8A:
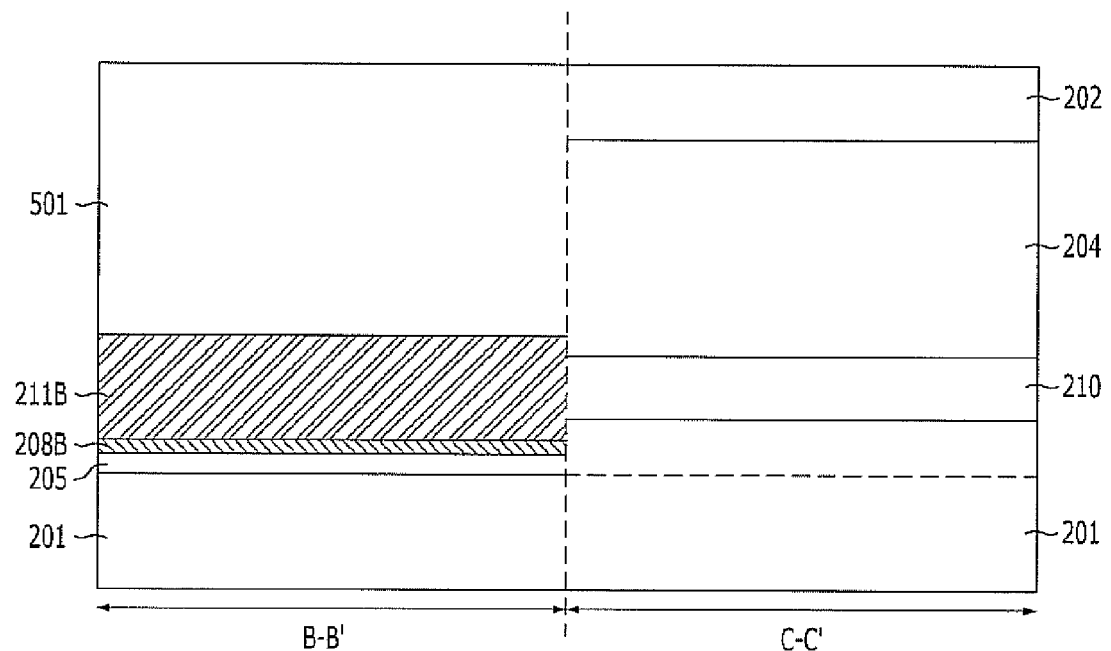
FIGS. 8A to 8E illustrate the method for fabricating a semiconductor device after a buried bit line is formed, in accordance with the embodiments of the present invention.

Referring to FIG. 8A, a first interlayer dielectric layer 501 is formed on the entire surface of the resultant structure having the buried bit line 211B formed therein. The first interlayer dielectric layer 501 fills the space over the buried bit line 211B. The first interlayer dielectric layer 501 includes an oxide, such as Borophoshosilicate glass (BPSG).

The first interlayer dielectric layer 501 is planarized until the surface of the hard mask layer 202 is exposed. The planarization is performed by a CMP process.

Figure 8B:
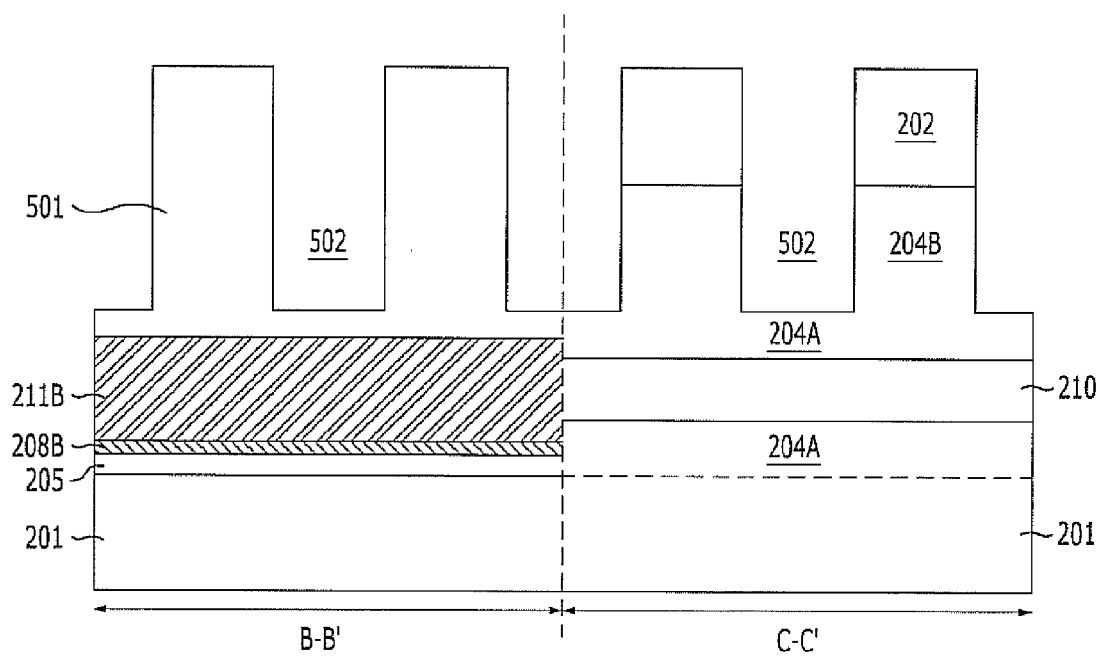

Referring to FIG. 8B, a plurality of word line trenches 502 is formed. In order to form the plurality of word line trenches 502, a photoresist pattern, which is not illustrated, is used. The photoresist pattern includes a line/space pattern in a direction crossing the buried bit line 211B. Accordingly, the buried bit line 211B and the word line trenches 502 cross each other. The photoresist pattern is used as an etch barrier to etch the first interlayer dielectric layer 501 to a designated depth. When the first interlayer dielectric layer 501 is etched, the hard mask layer 202 and the body 204 are also etched to a designated depth.

Accordingly, the body 204 is divided into an active body 204A and an active pillar 204B. A plurality of active pillars 204B is formed on a plurality of active bodies 204A. More specifically, the plurality of active pillars 204B are formed on one active body 204A, and isolated from each other by the word line trenches 502. The active bodies 204A and the active pillars 204B are an active region. Each of the active bodies 204A is where a junction 210 is formed. The active pillars 204B extend vertically over the active body 204A. The remaining thickness of the first interlayer dielectric layer 501 serves as an isolation layer between the buried bit line 211B and a vertical word line.

Figure 8C:
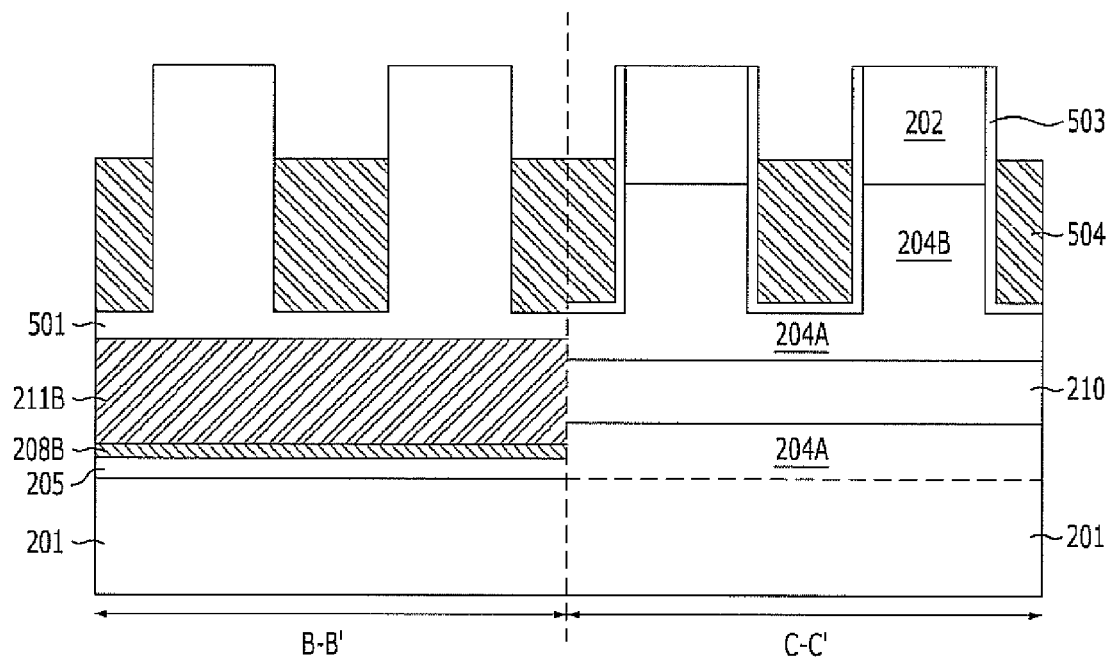

Referring to FIG. 8C, a gate dielectric layer 503 is formed on the entire structure including the active bodies 204A, the sidewalls of the active pillars 204B, and sidewalls of the hard mask layer 202. A third conductive layer 504 is formed to fill the word line trenches 502. Then, a planarization and etchback process is performed so that the third conductive layer 504 partially fills the word line trenches 502. The third conductive layer 504 may be formed of a polysilicon layer, or a metal layer such as tungsten may be used to reduce resistance. Furthermore, the third conductive layer 504 may also be formed of a metal nitride such as TiN.

Figure 8D:
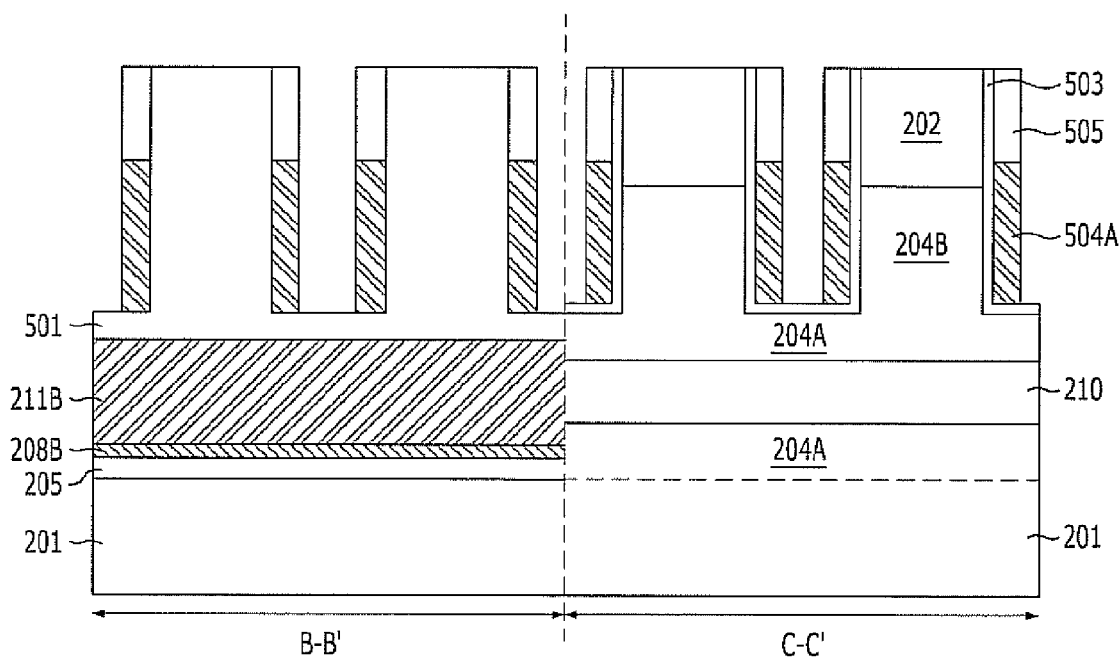

Referring to FIG. 8D, a spacer 505 is formed by performing an etch back process after a dielectric layer used as the spacer 505 is deposited. The dielectric layer used as the spacer 505 includes a nitride and an oxide.

Using the spacer 505 as an etch barrier, the third conductive layer 504 is etched. Accordingly, a vertical word line 504A is formed on the sidewalls of each active pillar 204B. In another embodiment, after a plurality of ring-shaped vertical gates is formed to surround the active pillars 204B, a vertical word line 504A may be formed to couple with the adjacent vertical gates. The vertical word line 504A is formed in a direction crossing the buried bit line 211B.

In this embodiment, the etching process using the spacer 505 is applied to form the vertical word line. However, a photoresist pattern may be used to etch the third conductive layer to form the vertical word line.

Figure 8E:
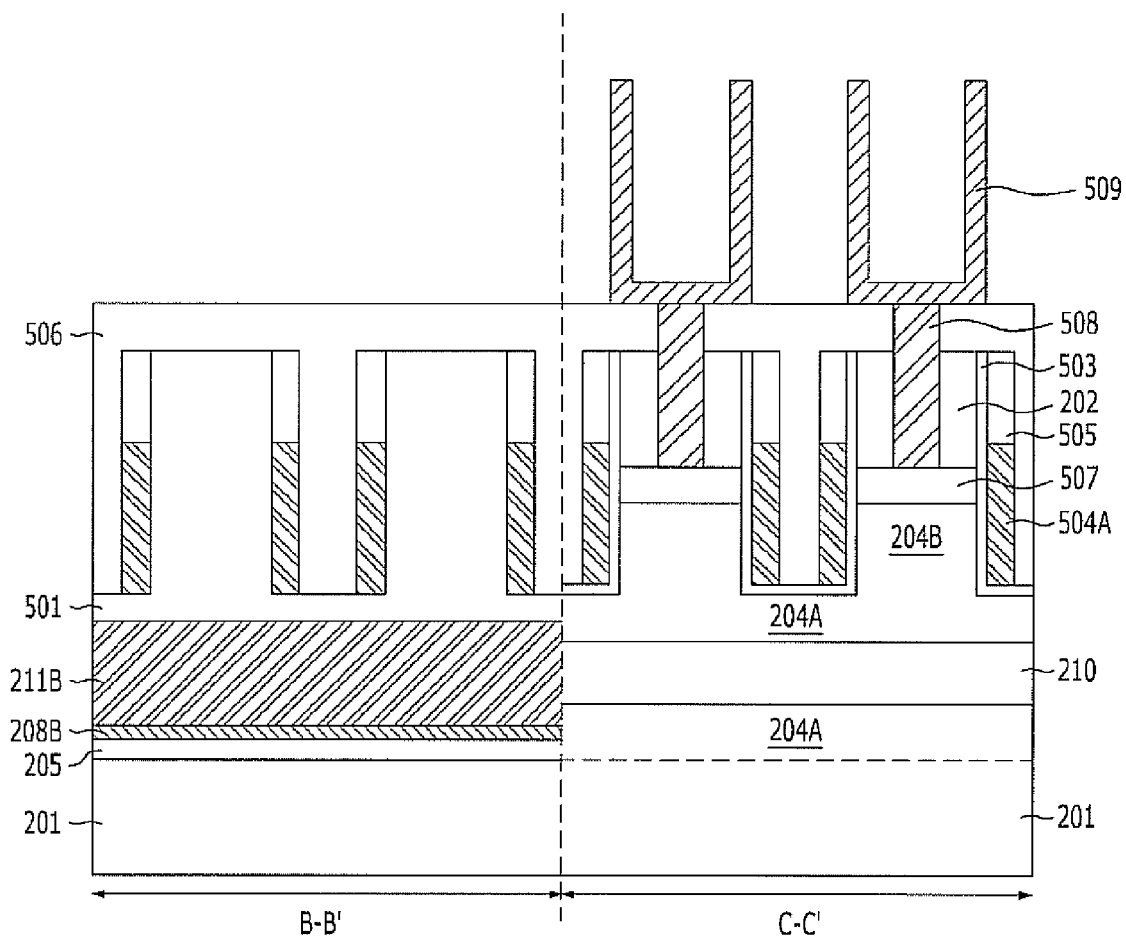

Referring to FIG. 8E, a second interlayer dielectric layer 506 is formed on the entire surface including the vertical word line 504A.

Storage node contact etching is performed to expose the upper portion of the active pillar 204B. Then, a storage node contact plug 508 is formed. Before the storage node contact plug 508 is formed, ion implantation may be performed to form another junction, more specifically, a drain 507. Accordingly, a vertical channel transistor is formed by the drain 507, the junction 210, and the vertical word line 504A. A vertical channel is formed between the drain 507 and the junction 210 by the vertical word line 504A. The junction 210 is a source of the vertical channel transistor.

A storage node 509 is formed on the storage node contact plug 508. The storage node 509 may have a cylindrical shape. In another embodiment, the storage node 509 may be formed in a pillar or concave shape. Subsequently, a dielectric layer and an upper electrode are formed.

In accordance with the embodiments of the present invention, the junction extension portion is formed between the buried bit line and the junction, using a polysilicon layer. Therefore, a silicide process may be omitted, which makes it possible to substantially prevent a loss of the junction and a junction leakage.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a plurality of active bodies isolated by a plurality of trenches and having two sidewalls;
   a plurality of junctions formed on a sidewall of the sidewalls of the respective active bodies;
   a dielectric layer having a plurality of open portions to expose the respective junctions and covering both sidewalls of the active bodies;
   a plurality of buried bit lines formed over the dielectric layer and partially filling the respective trenches; and
   a plurality of junction extension portions filling the respective open portions and formed between the buried bit lines and the junctions,
   wherein the junction extension portions are formed over the plurality of buried bit lines.

2. The semiconductor device of claim 1, wherein the junction extension portion is formed between the buried bit line and the dielectric layer.

3. The semiconductor device of claim 1, wherein the junction extension portion comprises a silicon layer.

4. The semiconductor device of claim 1, wherein the junction extension portion comprises an impurity-doped polysilicon layer.

5. The semiconductor device of claim 1, wherein the buried bit line comprises a metal layer or metal nitride.

6. The semiconductor device of claim 1, wherein the junction extension portion comprises a polysilicon layer, and the buried bit line comprises a TiN layer.

7. A semiconductor device comprising:
a plurality of active bodies isolated by a plurality of first trenches and having two sidewalls;
a plurality of junctions formed in a sidewall of the sidewalls of the respective active bodies;
a dielectric layer having a plurality of open portions to expose the respective junctions and covering both sidewalls of the active bodies;
a plurality of buried bit lines formed over the dielectric layer and partially filling the respective trenches;
a plurality of junction extension portions formed between the buried bit lines and the junctions and filling the respective open portions;
a plurality of active pillars formed over the respective active bodies and isolated by a plurality of second trenches in a direction crossing the first trenches;
a plurality of vertical word lines formed on sidewalls of the active pillars and extended in a direction crossing the buried bit lines; and
a plurality of capacitors coupled to upper portions of the respective active pillars
wherein the junction extension portions are formed over the buried bit lines.

8. The semiconductor device of claim 7, wherein the junction extension portion comprises a silicon layer.

9. The semiconductor device of claim 7, wherein the junction extension portion comprises an impurity-doped polysilicon layer.

10. The semiconductor device of claim 7, wherein the buried bit line comprises a metal layer or metal nitride.

11. The semiconductor device of claim 7, wherein the junction extension portion comprises a polysilicon layer, and the buried bit line comprises a TiN layer.

* * * * *